(12) United States Patent
Leng et al.

(10) Patent No.: US 7,511,947 B2
(45) Date of Patent: Mar. 31, 2009

(54) CIRCUIT BOARD WITH A PERFORATED STRUCTURE FOR DISPOSING A HEAT PIPE

(75) Inventors: Yao-Shih Leng, Taipei (TW); Yao-Yi Huang, Taipei (TW); Shang-Chih Yang, Changhua County (TW)

(73) Assignee: Micro-Star Int'l Co., Ltd., Jung-He, Taipei Hsien (TW)

( * ) Notice: Subject to any disclaimer, the term of this patent is extended or adjusted under 35 U.S.C. 154(b) by 56 days.

(21) Appl. No.: 11/566,236

(22) Filed: Dec. 4, 2006

(65) Prior Publication Data

US 2008/0062649 A1 Mar. 13, 2008

(30) Foreign Application Priority Data

Sep. 8, 2006 (TW) .............................. 95216025 U

(51) Int. Cl.
*H05K 7/20* (2006.01)
(52) U.S. Cl. .................. 361/679.52; 361/700; 361/719; 257/715; 174/15.2; 165/104.21; 165/104.26
(58) Field of Classification Search ........................ None
See application file for complete search history.

(56) References Cited

U.S. PATENT DOCUMENTS

| | | | | |
|---|---|---|---|---|
| 5,581,443 A * | 12/1996 | Nakamura et al. | .......... | 361/705 |
| 5,793,611 A * | 8/1998 | Nakazato et al. | ............ | 361/704 |
| 6,052,285 A * | 4/2000 | Hileman | ..................... | 361/699 |
| 6,724,625 B2 * | 4/2004 | Inoue | .......................... | 361/700 |
| 6,937,474 B2 | 8/2005 | Lee | | |
| 7,019,974 B2 * | 3/2006 | Lee et al. | .................... | 361/700 |
| 7,209,356 B2 * | 4/2007 | Lee et al. | .................... | 361/719 |
| 7,248,479 B2 * | 7/2007 | Summers et al. | ............ | 361/721 |
| 7,277,286 B2 * | 10/2007 | Lee | .............................. | 361/700 |
| 7,319,588 B2 * | 1/2008 | Peng et al. | ................... | 361/700 |
| 7,327,576 B2 * | 2/2008 | Lee et al. | .................... | 361/719 |
| 7,477,515 B2 * | 1/2009 | Tsai et al. | ................... | 361/700 |

\* cited by examiner

*Primary Examiner*—Boris L Chervinsky
(74) *Attorney, Agent, or Firm*—Winston Hsu

(57) ABSTRACT

A circuit board includes a substrate forming an opening, a first thermal module disposed on a first side of the substrate, a second thermal module disposed on a second side opposite to the first side of the substrate m, and a heat pipe installed on the substrate and passing through the opening. A first end of the heat pipe is connected to the first thermal module, and a second end of the heat pipe is connected to the second thermal module.

13 Claims, 8 Drawing Sheets

CIRCUIT BOARD WITH A PERFORATED STRUCTURE FOR DISPOSING A HEAT PIPE

BACKGROUND OF THE INVENTION

1. Field of the Invention

The present invention relates to a circuit board with a perforated structure for disposing a heat pipe, and more particularly, to a circuit board with a perforated structure for disposing a heat pipe to connect thermal modules on both sides of a substrate.

2. Description of the Prior Art

In modern information society, computer systems are becoming necessities, such as desktops, notebook computers, servers, and so on. The operation speed of computers is getting faster and faster so that the computer is becoming powerful and is utilized in a wide variety of fields. Therefore, components of the computer generate more heat when processing operations than before. If the heat generated by the components of the computer can not be dissipated effectively, the stability and operation speed of the computer will be reduced.

In U.S. Pat. No. 6,937,474, a display card with a heat pipe structure is disclosed. The heat pipe structure is introduced as follow. Please refer to FIG. 1. FIG. 1 is a diagram of a display card 10 in the prior art. The display card 10 includes a substrate 12 which can a printed circuit board, a first thermal module 14 disposed on a first side 121 of the substrates 2, a second thermal module 16 disposed on a second side 122 opposite to the first side 121 of the substrate 12, and a heat pipe 18. The first thermal module 14 can be disposed above a graphic processing unit 20 for dissipating heat generated by the graphic processing unit 20 directly. When the graphics processing unit 20 processes complicated operations, such as 3D image processing, so as to generate lots of heat, the heat cannot be dissipated easily. There is a need to transmit the heat to the second thermal module 16 via the heat pipe 18 for dissipating the heat out of the graphic processing unit 20. The advantages of disposing the second thermal module 16 on the back side (the second side 122) of the display card 10 is not only economizing space on the front side (the first side 121) of the display card 10 but also dissipating the heat easily by a fan of a center processing unit neighboring to the back side of the display card 10. A first end 181 of the heat pipe 18 is connected to the first thermal module 14, and a second end 181 of the heat pipe 18 is connected to the second thermal module 16. The heat pipe 18 detours around the substrate 12 so that the first end 181 and the second end 182 of the hear pipe 18 can be connected to the first thermal module 14 and the second thermal module 16 respectively. Therefore material of the heat pipe 18 increases and the heat can not be dissipated immediately. In addition, the disposition of the heat pipe 18 detouring around the substrate 12 causes inconvenience of mechanical design and obstructs disposition of other components.

SUMMARY OF THE INVENTION

It is therefore a primary objective of the claimed invention to provide a circuit board with a perforated structure for disposing a heat pipe to connect thermal modules on both sides of a substrate for solving the above-mentioned problem.

According to the claimed invention, a circuit board includes a substrate forming an opening, a first thermal module disposed on a first side of the substrate, a second thermal module disposed on a second side opposite to the first side of the substrate m, and a heat pipe installed on the substrate and passing through the opening. A first end of the heat pipe is connected to the first thermal module, and a second end of the heat pipe is connected to the second thermal module.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
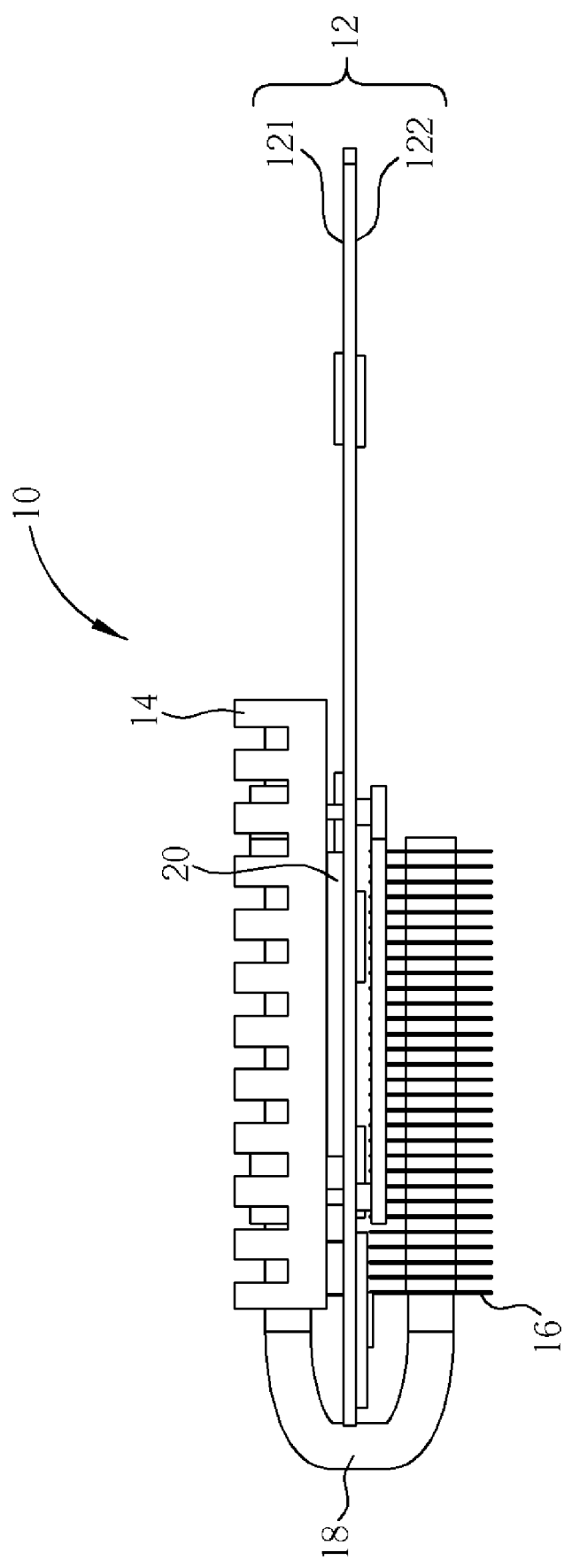
FIG. 1 is a diagram of a display card in the prior art.
Figure 2:
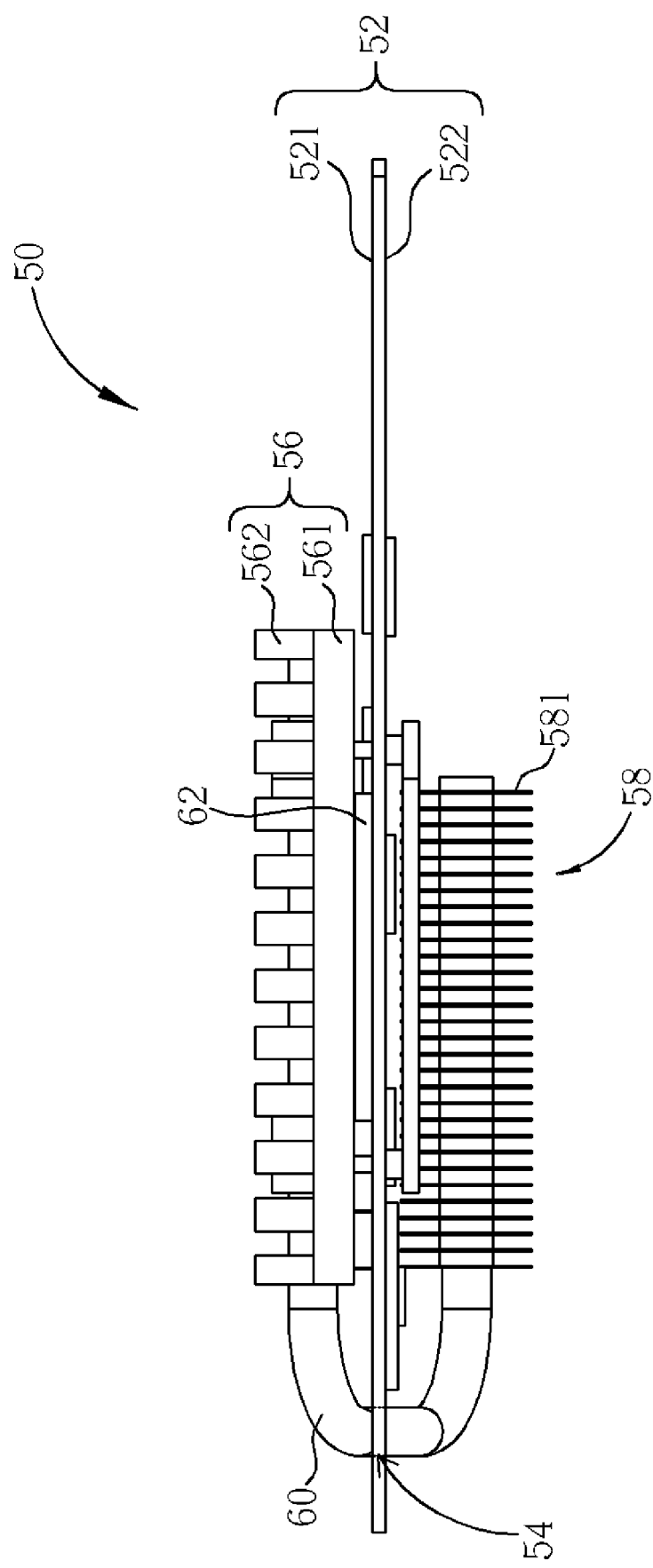
FIG. 2 is a lateral view of a circuit board according to a first embodiment of the present invention.
Figure 3:
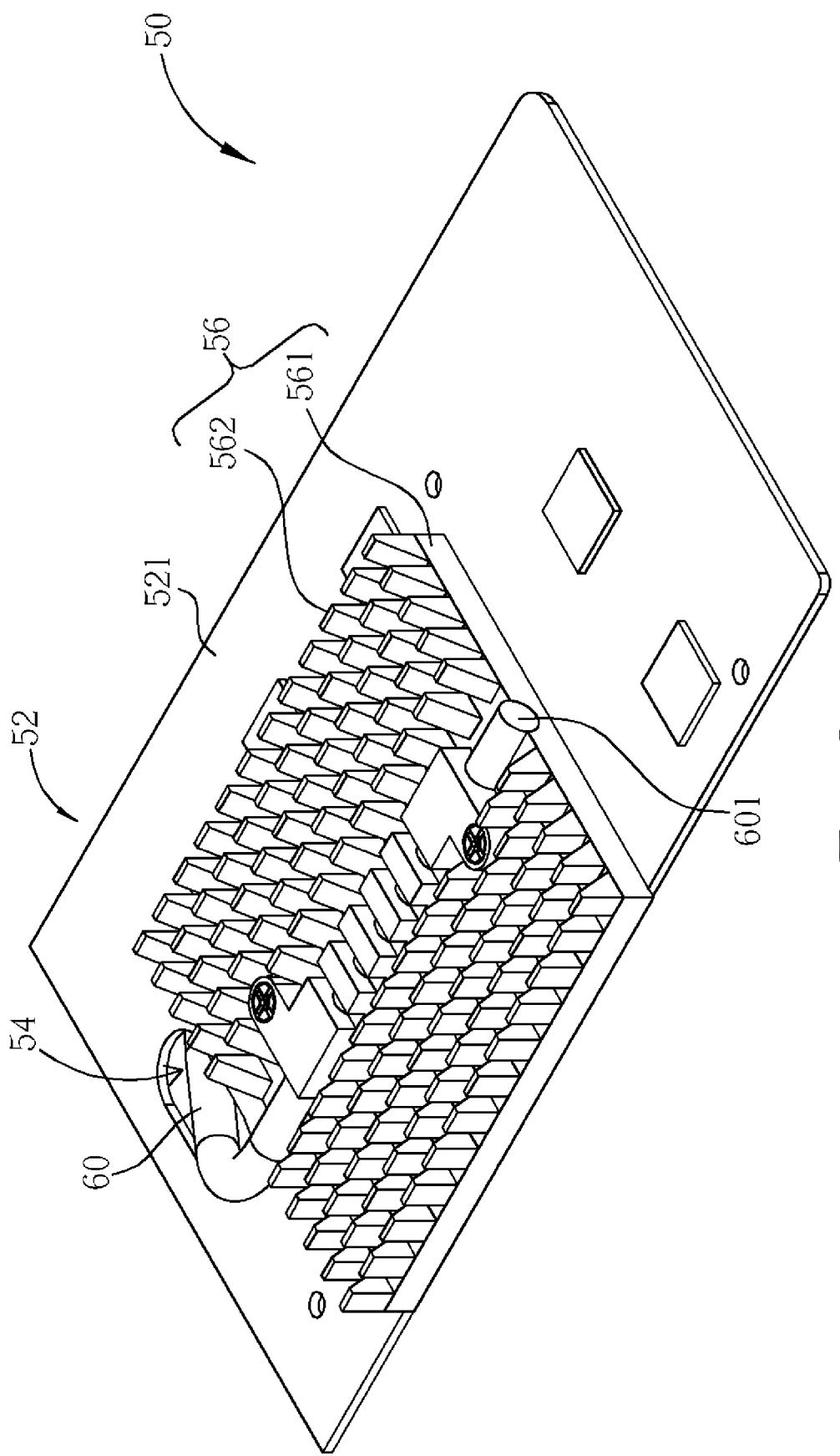
FIG. 3 is a front view of the circuit board according to the first embodiment of the present invention.
Figure 4:
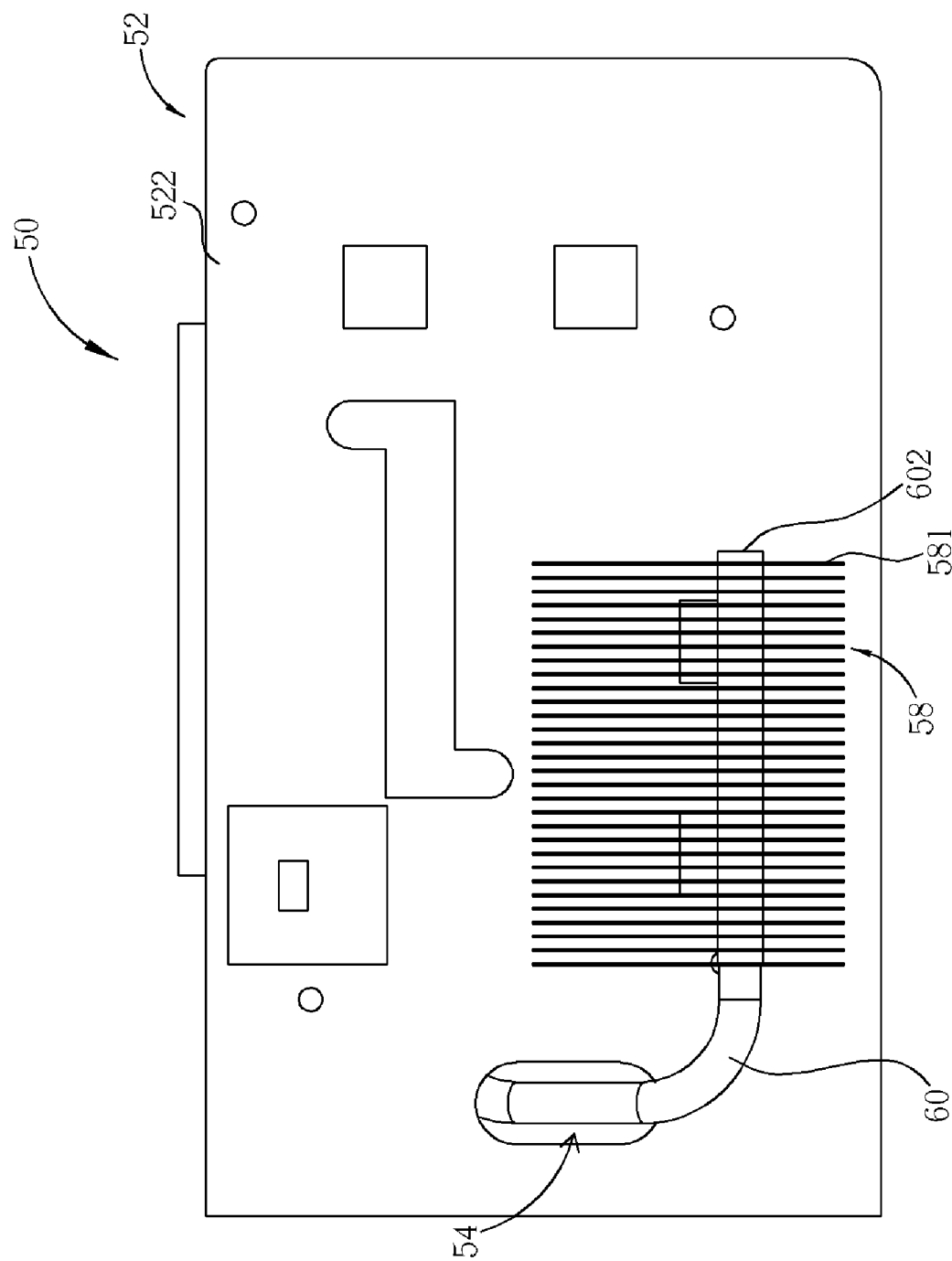
FIG. 4 is a back view of the circuit board according to the first embodiment of the present invention.

Please refer to FIG. 2 to FIG. 4. FIG. 2 is a lateral view of a circuit board 50 according to a first embodiment of the present invention. FIG. 3 is a front view of the circuit board 50 according to the first embodiment of the present invention. FIG. 4 is a back view of the circuit board 50 according to the first embodiment of the present invention. The circuit board 50 can be an interface card, such as a display card or a motherboard. The circuit board 50 includes a substrate 52 which can a printed circuit board. An opening 54 is formed on a region without a layout of the substrate 52. The circuit board 50 further includes a first thermal module 56 disposed on a first side 521 of the substrate 52, a second thermal module 58 disposed on a second side 522 opposite to the first side 521 of the substrate 52, and at least one heat pipe 60 which can be a U-shaped heat pipe. The first thermal module 56 can be disposed above a processing unit 62 for dissipating heat generated by the processing unit 62 directly. The processing unit 62 can be a graphic processing unit. The first thermal module 56 includes a heat sink 561 installed above the processing unit 32 for dissipating the heat generated by the processing unit 62, and a plurality of fins 562 disposed on the heat sink 561 for increasing a heat-dissipating area. The second thermal module 58 includes a plurality of fins 581. The second thermal module 58 also can include a heat sink.

A curved part of the heat pipe 60 passes through the opening 54 of the substrate 52 so that a first end 601 of the heat pipe 60 is connected to the first thermal module 56 and a second end 602 of the heat pipe 60 is connected to the second thermal module 58. The heat pipe 60 transmits the heat generated by the processing unit 62 to the second thermal module 58 on the back side of the circuit board 50 for dissipating the heat out of the processing unit 62. The advantages of disposing the second thermal module 58 on the back side (the second side 522) of the circuit board 50 is not only economizing space on the front side (the first side 521) of the circuit board 50 but also dissipating the heat easily by a fan of a center processing unit neighboring to the back side of the circuit board 50. In this embodiment, an end of the heat pipe 60 needs to pass through the opening 54 of the substrate 52 first, and the heat pipe 60 turns so that the curved part of the heat pipe 60 is disposed inside the opening 54 of the substrate 52 and two linear parts of the heat pipe 60 are disposed on both sides of the substrate 52 respectively. At last the first thermal module 56 and the second thermal module 58 are installed on the first end 601 and the second end 602 of the heat pipe 60 respectively. The opening 54 of the substrate 52 needs to be close to an edge of the substrate 52 for disposing the curved part of the heat pipe 60 inside the opening 54 easily.

Figure 5:
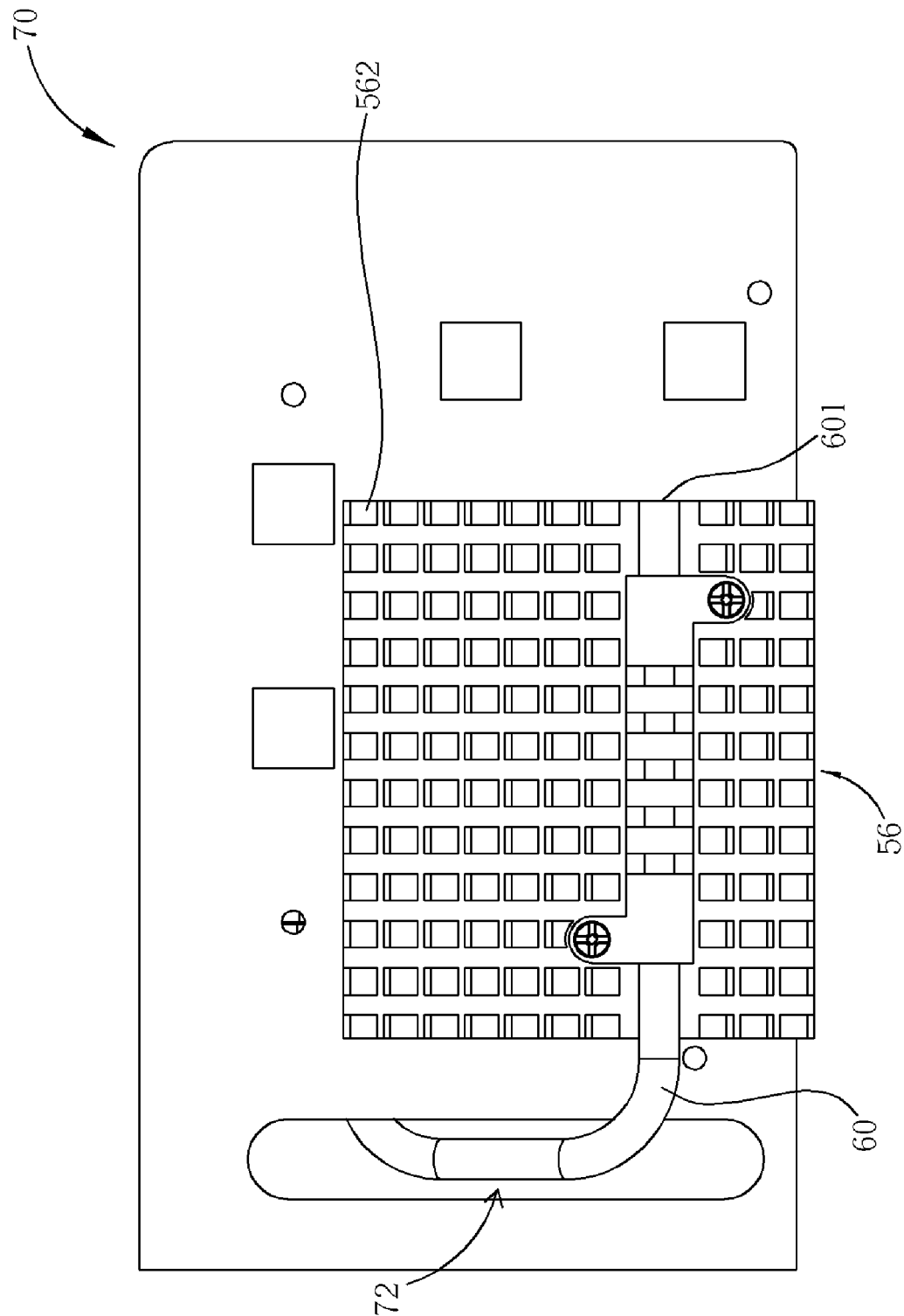
FIG. 5 and FIG. 6 are diagrams of a circuit board according to a second embodiment of the present invention.
Figure 6:
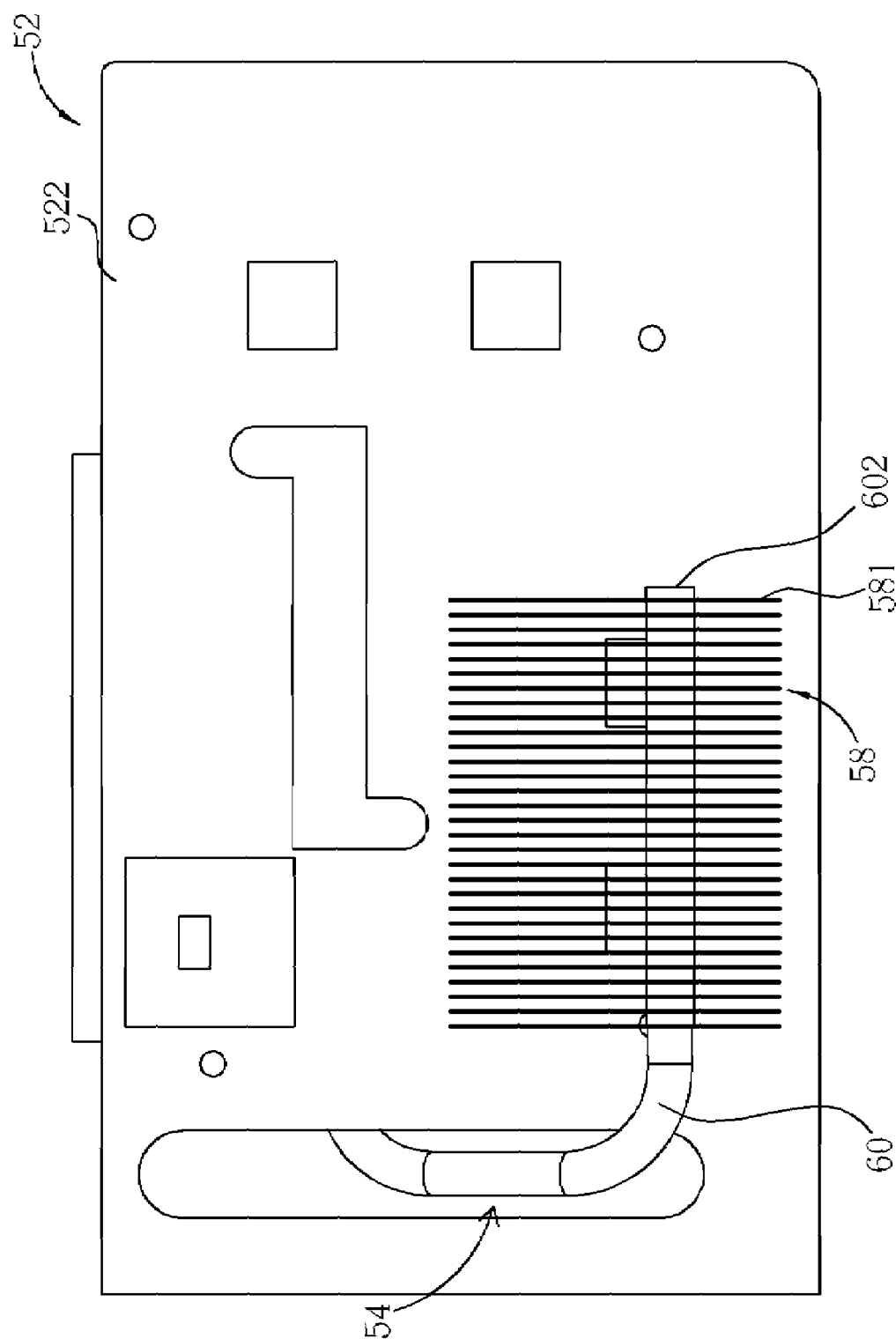

Please refer to FIG. 5 and FIG. 6. FIG. 5 and FIG. 6 are diagrams of a circuit board 70 according to a second embodiment of the present invention. The difference between the first embodiment and the second embodiment is that a groove 72 is formed on the substrate 52 of the circuit board 70 in the second embodiment. A length of the groove 72 is greater than a length of the linear part of the heat pipe 60. The first end 601 and the second end 602 of the heat pipe 60 can pass through the groove 72 and the heat pipe 60 can turn inside the groove 72 directly so that the curved part of the heat pipe 60 is disposed inside the groove 72 of the substrate 52 and the two linear parts of the heat pipe 60 are disposed on both sides of the substrate 52 respectively. At last the first thermal module 56 and the second thermal module 58 are installed on the first end 601 and the second end 602 of the heat pipe 60 respectively. The groove 72 of the substrate 52 does not need to be close to an edge of the substrate 52 for disposing the curved part of the heat pipe 60 inside the groove 72 easily.

Figure 7:
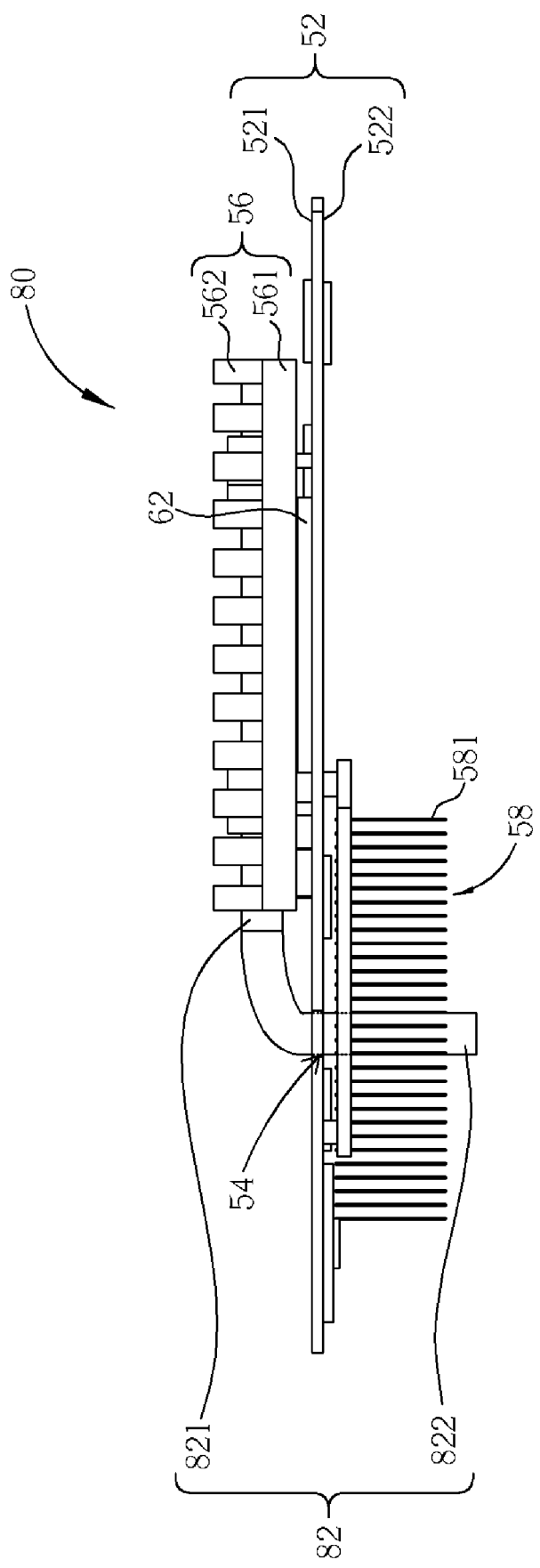
FIG. 7 is a diagram of a circuit board according to a third embodiment of the present invention.

Please refer to FIG. 7. FIG. 7 is a diagram of a circuit board 80 according to a third embodiment of the present invention. The circuit board 80 includes the substrate 52. The opening 54 is formed on a region without a layout of the substrate 52. The circuit board 80 further includes the first thermal module 56 disposed on the first side 521 of the substrate 52, and the second thermal module 58 disposed on the second side 522 opposite to the first side 521 of the substrate 52. The difference between the first embodiment and the third embodiment is that the circuit board 80 further includes a heat pipe 82 which is an L-shaped heat pipe. A first section 821 of the heat pipe 82 is connected to the first thermal module 56, and a second section 822 of the heat pipe 82 passes through the opening 54 of the substrate 52 and is connected to the second thermal module 58. The heat pipe 82 transmits the heat generated by the processing unit 62 to the second thermal module 58 on the back side of the circuit board 50 for dissipating the heat out of the processing unit 62. Because the second section 822 of the heat pipe 82 passes through the opening 54 directly and the first thermal module 56 and the second thermal module 58 are installed on the first section 821 and the second section 822 of the heat pipe 82 respectively, the opening 54 of the substrate 52 does not need to be close to an edge of the substrate 52 for disposing the heat pipe 82 inside the opening 54 easily.

Figure 8:
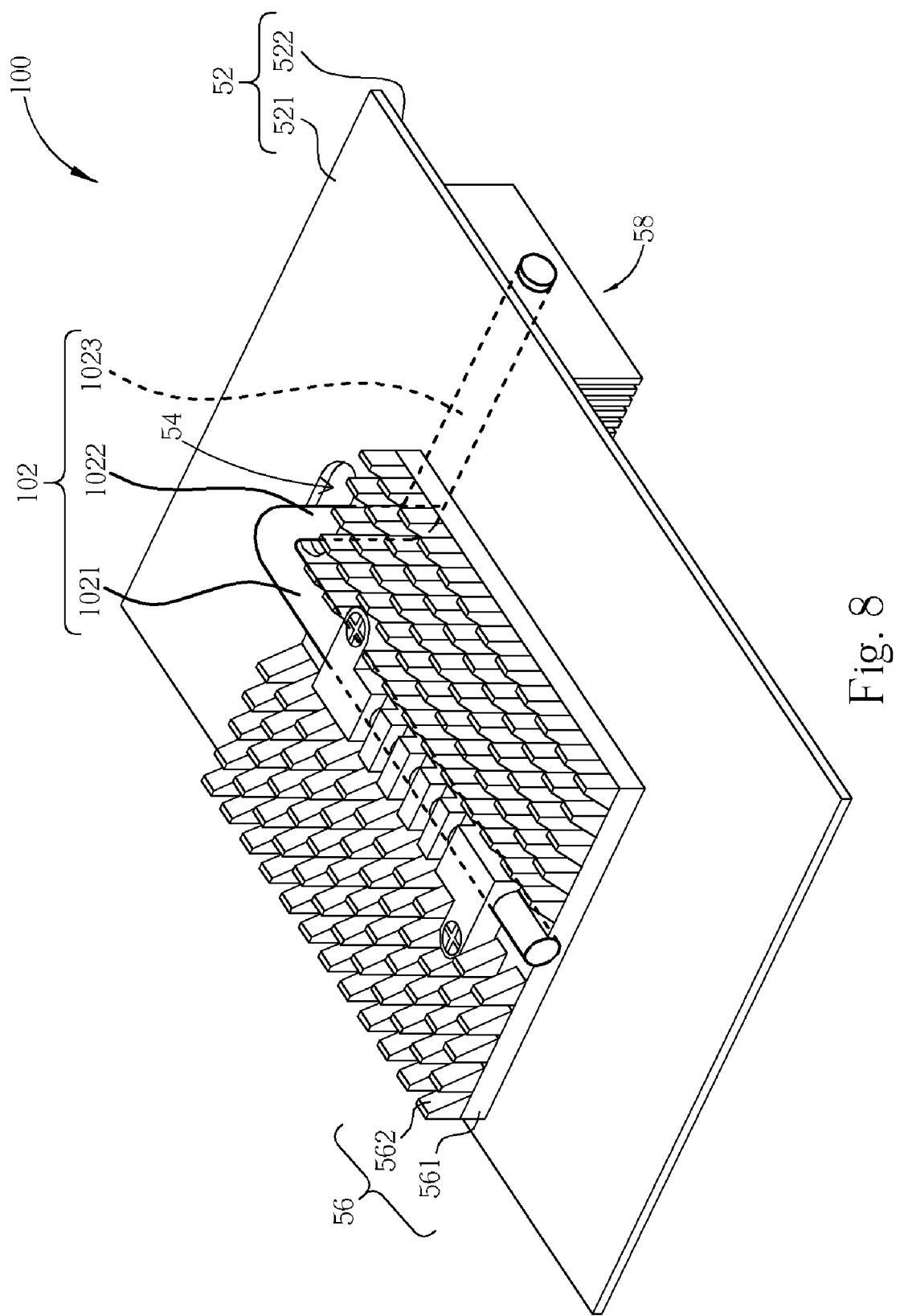
FIG. 8 is a diagram of a circuit board according to a fourth embodiment of the present invention.

Please refer to FIG. 8. FIG. 8 is a diagram of a circuit board 100 according to a fourth embodiment of the present invention. The circuit board 100 includes the substrate 52. The opening 54 is formed on a region without a layout of the substrate 52. The circuit board 100 further includes the first thermal module 56 disposed on the first side 521 of the substrate 52, and the second thermal module 58 disposed on the second side 522 opposite to the first side 521 of the substrate 52. The difference between the first embodiment and the above embodiments is that the circuit board 100 further includes a heat pipe 102 with multiple sections. The heat pipe 102 includes a first section 1021, a second section 1022, and a third section 1023. The second section 1022 of the heat pipe 102 passes through the opening 54 of the substrate 52, and the first section 1021 and the third section 1023 are disposed on both sides of the substrate 52 respectively. The first thermal module 56 and the second thermal module 58 are installed on the first section 1021 and the third section 1023 of the heat pipe 102 respectively. An included angle is formed between the first section 1021 and the third section 1023, that is, an included angle is formed between a projective vector of the first section 1021 and a projective vector of the third section 1023 of the heat pipe 102 on the substrate 52. The included angle ranges from 0° to 180°, such as 90°. An end of the heat pipe 102 needs to pass through the opening 54 of the substrate 52 first, and the heat pipe 102 turns so that the second section 1022 of the heat pipe 102 is disposed inside the opening 54 of the substrate 52 and the first section 1021 and the third section 1023 of the heat pipe 102 are disposed on both sides of the substrate 52 respectively. At last the first thermal module 56 and the second thermal module 58 are installed on the first section 1021 and the third section 1023 of the heat pipe 102 respectively. The distance between the first section 1021 and the third section 1023 increases so as to provide a turn space of the second section 1022 for disposing the heat pipe 102 on the substrate 52 by forming the included angle between the first section 1021 and the third section 1023 of the heat pipe 102. The opening 54 of the substrate 52 does not need to be close to an edge of the substrate 52 for disposing the heat pipe 102 inside the opening 54 easily.

The structure of the heat pipe passing through the substrate so as to connect the thermal modules on the both sides of the substrate of the present invention can be utilized in all kinds of circuit boards, such as an interface card (a display card, a sound card, a network card), a motherboard, and so on. A plurality of openings can be disposed on the substrate, and a plurality of heat pipes can pass through the plurality of openings respectively.

In contrast to the conventional circuit board, the structure of the heat pipe passing through the substrate for connecting the thermal modules on the both sides of the substrate can reduce size and material of the heat pipe. The heat-transfer path of the heat pipe can be reduced accordingly so as to increase heat dissipation efficiency. Furthermore, the disposition of the heat pipe of the present invention does not detour around the substrate and obstruct disposition of other components. It benefits not only heat dissipation but also mechanical disposition.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit board comprising:
   a substrate forming an opening;
   a first thermal module disposed on a first side of the substrate;
   a second thermal module disposed on a second side opposite to the first side of the substrate; and
   a heat pipe comprising:
      a first section disposed on the first side of the substrate and connected to the first thermal module;
      a second section connected to the first section and passing through the opening on the substrate; and
      a third section disposed on the second side of the substrate and connected to the second section and the second thermal module, an included angle being formed between a projective vector of the first section and a projective vector of the third section on the substrate.

2. The circuit board of claim 1 wherein the substrate is a printed circuit board.

3. The circuit board of claim 1 wherein the first thermal module comprises a heat sink.

4. The circuit board of claim 3 wherein a plurality of fins is disposed on the heat sink.

5. The circuit board of claim 1 wherein the second thermal module comprises a heat sink.

6. The circuit board of claim 5 wherein the heat sink comprises a plurality of fins.

7. The circuit board of claim 1 wherein the heat pipe is a U-shaped heat pipe.

8. The circuit board of claim 1 wherein the heat pipe is an L-shaped heat pipe.

9. The circuit board of claim 1 wherein the opening of the substrate is a groove.

10. The circuit board of claim 1 wherein the included angle is equal to 90°.

11. The circuit board of claim 1 being a display card.

12. The circuit board of claim 11 further comprising a graphic processing unit installed on the substrate wherein the first thermal module is installed above the graphic processing unit.

13. The circuit board of claim 1 being a motherboard.

* * * * *